(12) United States Patent
Grieshaber et al.

(10) Patent No.: US 9,094,009 B2
(45) Date of Patent: Jul. 28, 2015

(54) METHOD OF OPENING A BYPASS SWITCH OF A HIGH VOLTAGE DIRECT CURRENT NETWORK

(71) Applicant: ALSTOM Technology Ltd, Baden (CH)

(72) Inventors: Wolfgang Grieshaber, Lyons (FR); Jean-Pierre Dupraz, Bressolles (FR)

(73) Assignee: ALSTOM TECHNOLOGY LTD., Baden (FR)

( * ) Notice: Subject to any disclaimer, the term of this patent is extended or adjusted under 35 U.S.C. 154(b) by 0 days.

(21) Appl. No.: 14/345,421

(22) PCT Filed: Sep. 20, 2012

(86) PCT No.: PCT/EP2012/068529
§ 371 (c)(1),
(2) Date: Mar. 18, 2014

(87) PCT Pub. No.: WO2013/041614
PCT Pub. Date: Mar. 28, 2013

(65) Prior Publication Data
US 2014/0347101 A1    Nov. 27, 2014

(30) Foreign Application Priority Data
Sep. 21, 2011 (FR) .................................. 11 58379

(51) Int. Cl.
*H03K 17/13* (2006.01)
*H02J 3/36* (2006.01)
*H02M 7/797* (2006.01)
*G01R 19/00* (2006.01)
*H03K 17/94* (2006.01)

(52) U.S. Cl.
CPC .......... *H03K 17/136* (2013.01); *G01R 19/0092* (2013.01); *H02J 3/36* (2013.01); *H02M 7/797* (2013.01); *H03K 17/94* (2013.01); *Y02E 60/60* (2013.01)

(58) Field of Classification Search
USPC ......................... 327/108–109, 453, 460, 468; 363/34–35, 37, 64–69
See application file for complete search history.

(56) References Cited

U.S. PATENT DOCUMENTS

2012/0218798 A1*    8/2012    Shimada ....................... 363/126

FOREIGN PATENT DOCUMENTS

| EP | 1037372 | A2 | 9/2000 |
| EP | 1986316 | A1 | 10/2008 |
| JP | 2000 050498 | A | 2/2000 |
| WO | 2007084041 | A1 | 7/2007 |

OTHER PUBLICATIONS

International Search Report for PCT/EP2012/068529 dated Jul. 10, 2013.
Written Opinion for PCT/EP2012/068529, (Sep. 20, 2012).

* cited by examiner

*Primary Examiner* — An Luu
(74) *Attorney, Agent, or Firm* — Pearne & Gordon LLP

(57) ABSTRACT

The invention relates to a method of opening a shunt switch carrying a current, the switch being connected in parallel with at least one thyristor of a high voltage DC network, interruption of the current flowing through the switch being initiated at the time of a current zero of the current flowing through the switch, the method being characterized in that it includes, based on a measurement effected by means for measuring the current flowing through the switch, a step of adjusting a control angle of the thyristor to position the current zero in a zone in which the time derivative of the measured current is a continuous function and the absolute value of a peak value of the measured current is substantially equal to the absolute value of the inaccuracy of the measurement of the current zero.

5 Claims, 6 Drawing Sheets

METHOD OF OPENING A BYPASS SWITCH OF A HIGH VOLTAGE DIRECT CURRENT NETWORK

TECHNICAL FIELD AND PRIOR ART

The present invention relates to a method of opening a shunt switch of a high voltage direct current (DC) network.

The document WO 2007/084041 discloses one example of a prior art high voltage DC network. That network is shown in FIG. 1. It includes a two-wire transmission line 1 constituted of a part 1a connected to the high voltage and a part 1b connected to the zero potential. A first converter 2 is connected at a first end of the line 1 between the part 1a and the part 1b. At the second end of the line 1 opposite the first end, a second converter 3 is likewise connected between the part 1a and the part 1b. The first converter 2 comprises two thyristor blocks 4, 5 connected in series, each thyristor block comprising three thyristors connected in parallel. Likewise, the second converter 3 comprises two thyristor blocks 6, 7 connected in series, each thyristor block comprising three thyristors connected in parallel. Each of the thyristors of the blocks 4, 5, 6, 7 of three thyristors is associated with a different phase. A shunt switch is connected in parallel with each thyristor block, namely:

a switch 8 in parallel with the thyristor block 4;
a switch 9 in parallel with the thyristor block 5;
a switch 10 in parallel with the thyristor block 6; and
a switch 11 in parallel with the thyristor block 7.

The converter 2 is connected to an alternating current (AC) generator network 12 and the converter 3 is connected to an AC consumer network 13. The first converter 2 is an AC to DC converter (rectifier) and the second converter 3 is a DC to AC converter.

The thyristor blocks 4 and 5, and likewise the switches 8 and 9, are controlled by respective control units 14 and 15. The thyristor blocks 6 and 7, and likewise the switches 10 and 11, are controlled by respective control units 16 and 17. Control devices 18 and 19 control the control units 14, 15, 16, and 17.

In the event of a system failure, it may prove necessary to short-circuit a thyristor block, for example the thyristor block 4. All of the thyristors of the block 4 are then short-circuited by closing the shunt switch 8. The thyristors of the block 6 must also be short-circuited at the same time by closing the shunt switch 10. This reduces the power transmitted on the line 1, but the system nevertheless continues to operate in a degraded mode. When the system has been repaired, the shunt switches 8 and 10 need to be opened again to enable current to flow in the thyristor blocks 4 and 6.

FIGS. 2 and 3 illustrate the phenomenon of opening a prior art shunt switch. FIG. 3 shows part of FIG. 2 to a larger scale. The curve C1 in FIGS. 2 and 3 shows the current I flowing through the switch as a function of time and the curve C2 shows the voltage V at the terminals of the switch as a function of time. The curve C1 has a zero value at a time $t_0$ and at times before time $t_0$ and the curve C2 has a zero value at time $t_0$ and at times after time $t_0$.

The current I that flows in the switch is adjusted to have a zero mean value at the moment of opening the shunt switch. This current with a zero mean value corresponds to a thyristor control angle substantially equal to 90°. As the person skilled in the art knows, the control angle of a thyristor is by definition the phase difference between the moment at which the potential difference applied to the thyristor renders it potentially able to conduct current if it were commanded to do so and the moment at which a command to conduct is really given to the thyristor.

For a switch opening command given at a time $t_a$ the current is interrupted at the time $t_0$ that is later than the time $t_a$ that corresponds to a zero crossing of the current. In FIGS. 2 and 3, the current is interrupted on a rising edge of the current curve. It is nevertheless equally possible for the current to be interrupted on a falling edge of the current curve.

As is apparent in FIGS. 2 and 3, when the current flowing through the switch is interrupted, a high overvoltage occurs at the terminals of the switch for a very short period. This is a problem. The high overvoltage at the terminals of the switch is liable to lead to the occurrence of an electric arc (breakdown of the switch) that damages the hardware (by piercing dielectric parts).

The invention is free of this problem.

SUMMARY OF THE INVENTION

The invention provides a method of opening a shunt switch carrying a current, the switch being connected in parallel with at least one thyristor of a high voltage DC network, interruption of the current flowing through the switch being initiated at the time of a current zero of the current flowing through the switch, the method being characterized in that it includes, based on a measurement effected by means for measuring the current flowing through the switch, a step of adjusting a control angle of the thyristor to position the current zero in a zone in which the time derivative of the measured current is a continuous function and the absolute value of a peak value of the measured current is substantially equal to the absolute value of the inaccuracy of the measurement of the current zero.

According to an additional feature of the invention, during a period that precedes opening of the switch and during which the current never includes a current zero and has an absolute value that remains greater than the value of the chopping current of the switch, an opening command is applied to the switch at a first time and a step of simultaneous adjustment of the control angle is initiated to move the peak values of the current closer to zero so that at a second time that is later than the first time, the contacts of the switch are separated by a substantially predefined distance enabling the switch to withstand a recovery voltage.

According to another additional feature of the invention, a step of measuring the distance between the contacts of the switch is initiated at the first time and a step of additional adjustment of the control angle is initiated at the second time to position the current in the zone in which the time derivative of the measured current is a continuous function and the absolute value of a peak value of the measured current is substantially equal to the absolute value of the inaccuracy of the measurement of the current zero.

According to a further additional feature of the invention, the second time is initiated by means of a timer device and at the second time a step of additional adjustment of the control angle is initiated to position the current in the zone in which the time derivative of the measured current is a continuous function and the absolute value of a peak value of the measured current is substantially equal to the absolute value of the inaccuracy of the measurement of the current zero.

According to a further additional feature of the invention, the second time is initiated by means of a position overshoot indicator when the distance between contacts reaches a substantially predefined distance and at the second time a step of additional adjustment of the control angle is initiated to position the current in the zone in which the time derivative of the measured current is a continuous function and the absolute value of a peak value of the measured current is substantially equal to the absolute value of the inaccuracy of the measurement of the current zero.

BRIEF DESCRIPTION OF THE FIGURES

Other features and advantages of the invention become apparent in the light of the following description given with reference to the appended drawings, in which.

The same references designate the same elements in all the figures.

DETAILED DESCRIPTION OF PARTICULAR IMPLEMENTATIONS OF THE INVENTION

Figure 4:
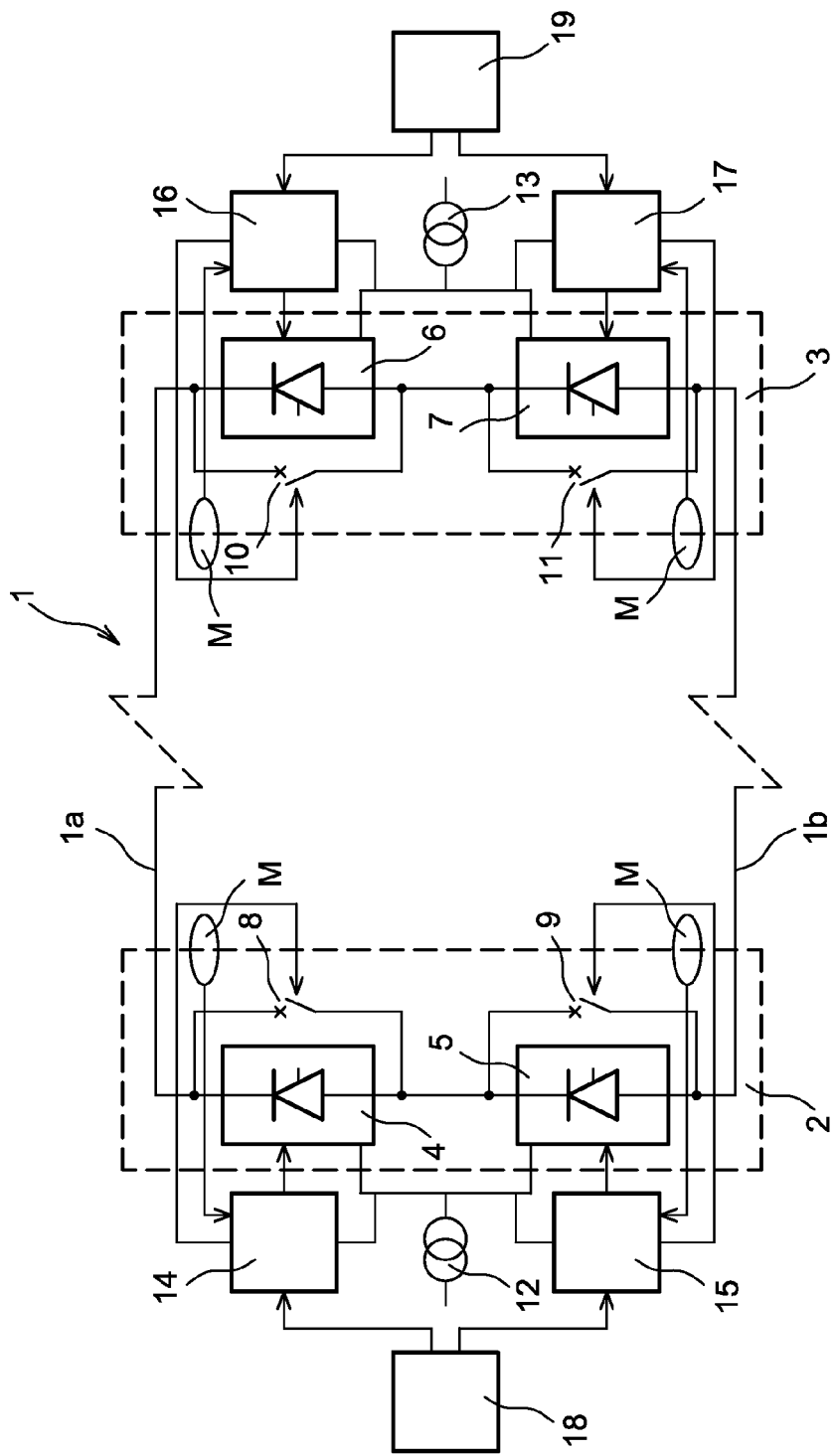
FIG. 4 shows an example of a high voltage DC network of the invention.

FIG. 4 shows an example of a high voltage DC network of the invention.

Figure 1:
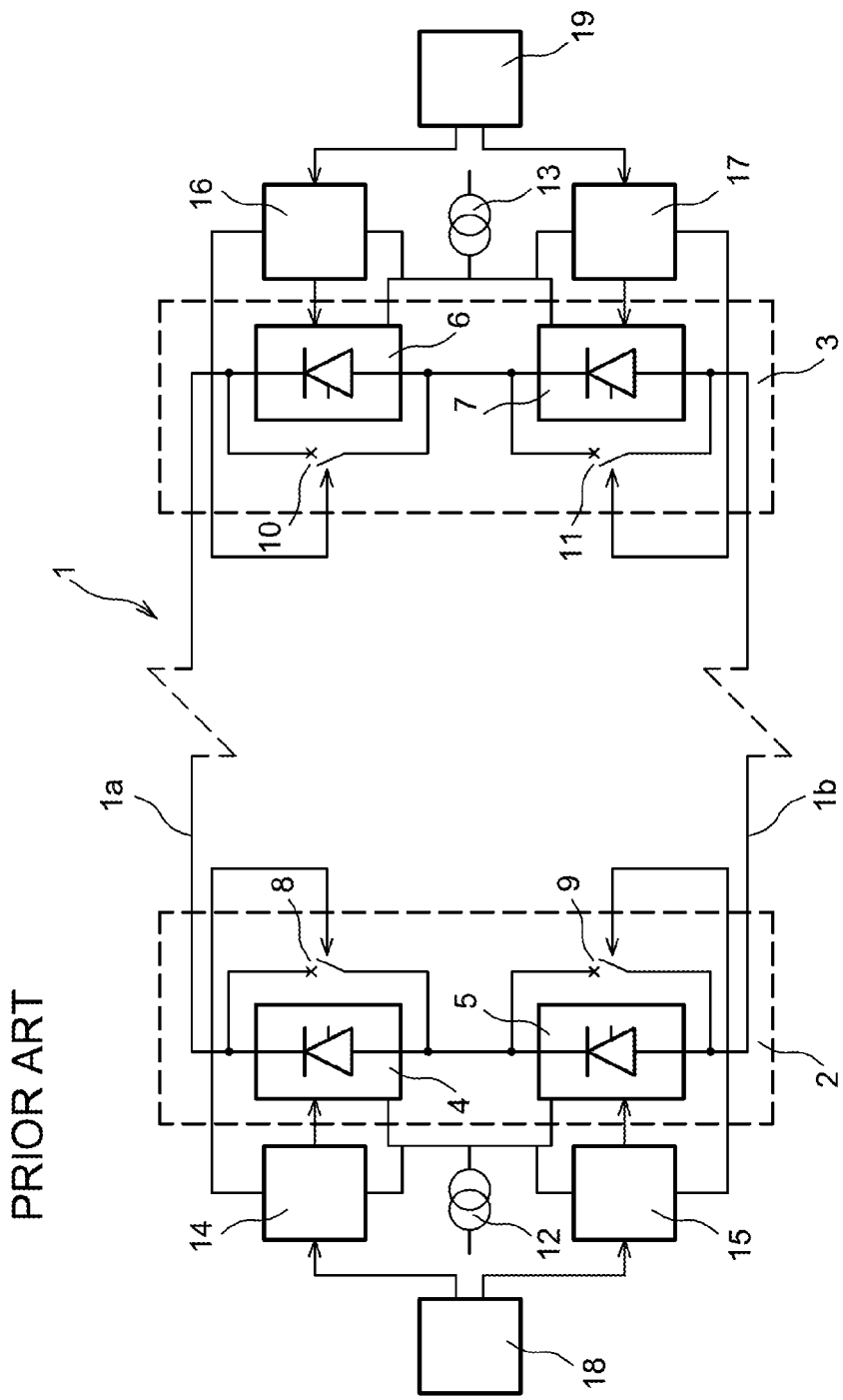
FIG. 1, already described, shows an example of a prior art high voltage DC network.
Figure 2:
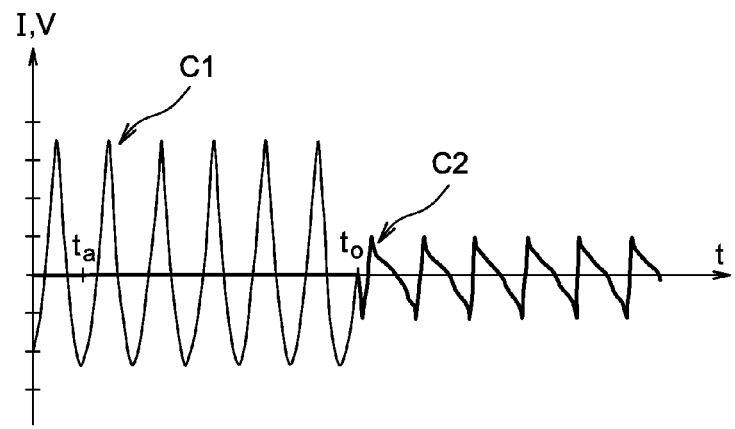
FIGS. 2 and 3, already described, show the phenomenon of opening a prior art shunt switch.
Figure 3:
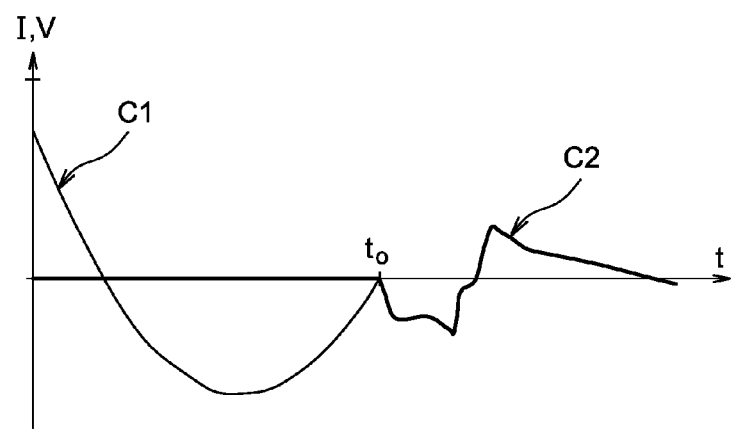

In addition to the elements shown in FIG. 1, the high voltage DC network of the invention includes current measuring means M that measure the current I that flows through each of the switches 8, 9, 10, and 11. The high voltage DC network of the invention further includes means for determining the time derivative of the measured current. In a first implementation of the invention the means for determining the time derivative of the measured current are computation means of the control units 14, 15, 16, 17 that compute the time derivative of the current from the current measurements. In a second implementation of the invention the means for determining the time derivative of the measured current include Rogowski coils through which the measured current flows. The Rogowski coils generate by induction a voltage that is proportional to variation in the current relative to time. These measurements are then sent to the control units 14, 15, 16, 17.

Figure 5:
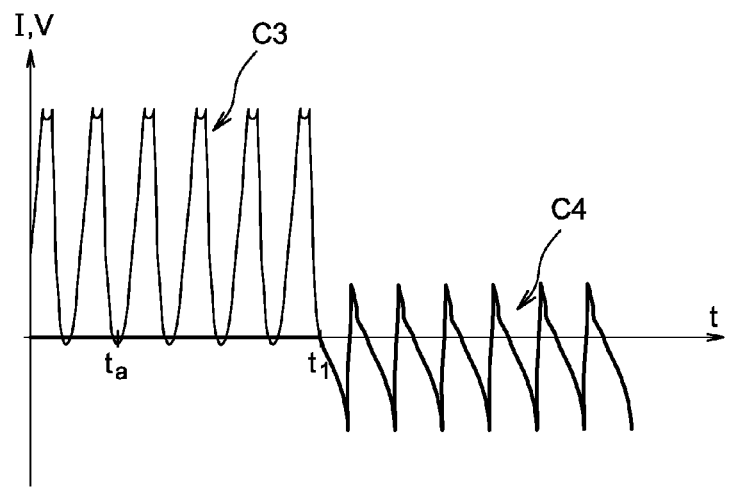
FIGS. 5, 6, and 7A-7C show the method of the invention for opening a shunt switch.
Figure 6:
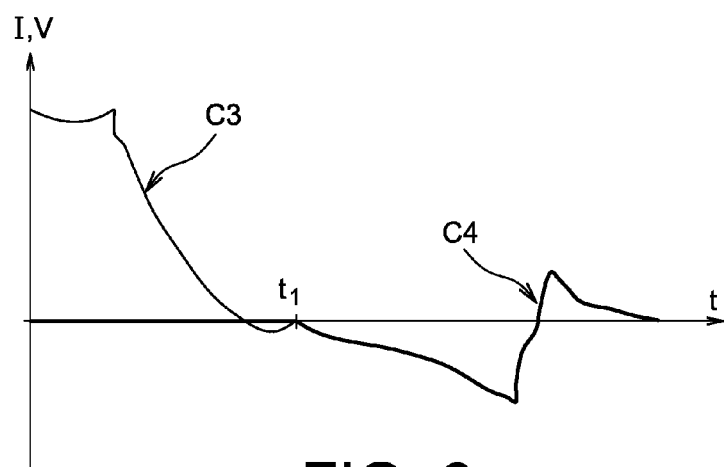

FIGS. 5, 6, and 7A-7C show the method of the invention for opening a shunt switch carrying a current. FIG. 6 shows part of FIG. 5 to a larger scale. The curve C3 in FIGS. 5, 6, and 7A-7C shows the current I that flows through the switch as a function of time and the curve C4 in FIGS. 5 and 6 shows the voltage V at the terminals of the switch as a function of time.

The current flowing through the switch is interrupted on a zero crossing of the current flowing through the switch. However, according to the invention, here the mean value of the current flowing through the switch is not zero.

The current I flowing through the switch is measured by the measuring means M and the measurement of the current I is sent to the corresponding control unit. Based on the current measurement information and the information relating to the time derivative of the current, the control unit delivers a signal that modifies the control angle of the thyristor until the current crosses zero in a zone in which the time derivative of the measured current is a continuous function and the absolute value of the peak value $I_m$ of the current substantially reaches or slightly exceeds the absolute value of the inaccuracy of the measurement of the current zero. The variation of the current as a function of time at the zero crossing then assumes a value that is one of the lowest values that it is possible to reach and the recovery voltage at the terminals of the switch is also low.

Figure 7A:
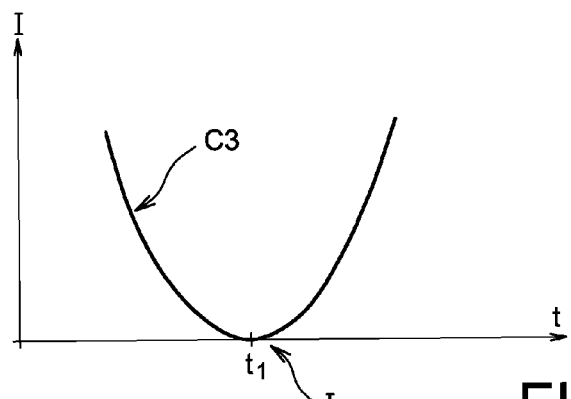
Figure 7B:
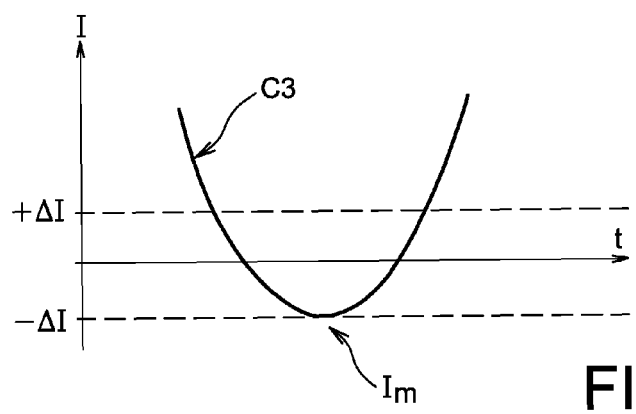
Figure 7C:
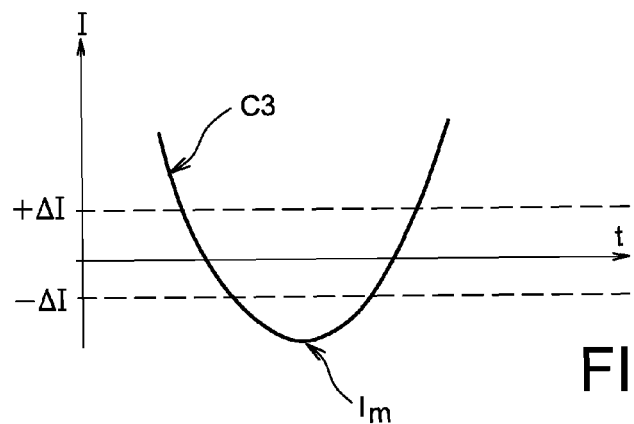

FIGS. 7A-7C show the zone of adjustment in which the current flowing through the switch is positioned to interrupt the current in accordance with the invention. FIG. 7A corresponds to the ideal situation in which there is no inaccuracy in the measurement of the current and FIGS. 7B-7C correspond to two real situations in which there are measurement inaccuracies.

In the ideal situation (FIG. 7A), the peak value $I_m$ of the current is zero and the derivative of the current at the zero crossing is also zero at a time $t_1$. The current is interrupted at this time $t_1$.

In the real situations, in which the instantaneous current is measured with an accuracy of $\pm \Delta I$, the condition in respect of the current referred to above is reflected in the fact that the minimum current $I_m$ is substantially equal to $-\Delta I$ (see FIG. 7B) or slightly less than $-\Delta I$ (see FIG. 7C). It is then certain that the current crosses zero and that the switch is opened with a low overvoltage at the terminals of the switch.

In FIGS. 5, 6, and 7A-7C, the current that flows through the switch has a positive mean value and the minimum current $I_m$ has a negative value substantially equal to $-\Delta I$. The invention also relates to the situation (not shown in the figures) in which the current that flows through the switch flows in the opposite direction and has a negative mean value, the maximum current $I_M$ having a positive value substantially equal to $+\Delta I$.

Figure 8:
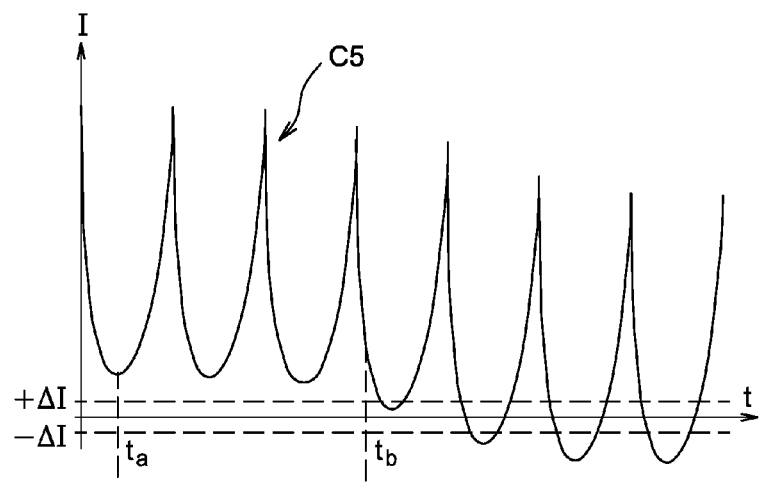
FIGS. 8 and 9 show an improvement to the method of the invention for opening a shunt switch.
Figure 9:
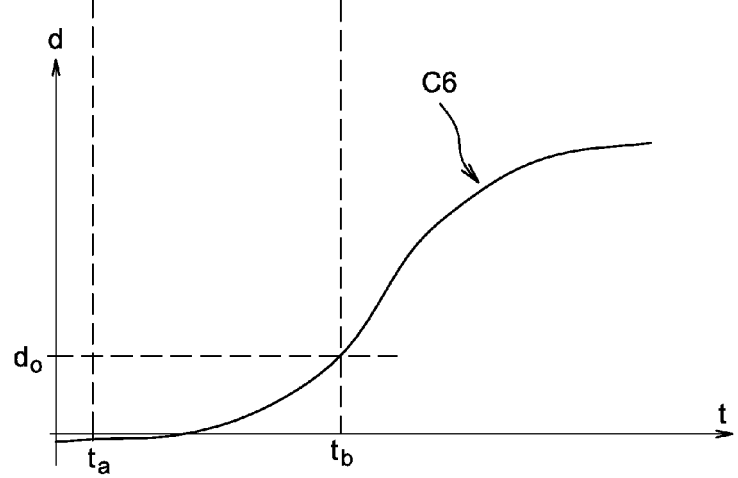

FIGS. 8 and 9 show an improvement to the method of the invention for opening a shunt switch. The curve C5 in FIG. 8 shows the current I flowing through the shunt switch as a function of time. The curve C6 in FIG. 9 shows the distance d between the contacts of the shunt switch as a function of time.

Before the command to open the switch is given, the instantaneous value of the current flowing through the switch does not cross zero and its absolute value remains at all times greater than the chopping current of the switch. The opening command is given at a time $t_a$. As soon as the opening command is given, the distance d between the contacts of the switch increases and the control angle is simultaneously modified to move the minima of the current curve closer to zero. At a time $t_b$ after time $t_a$, the distance between the contacts of the switch reaches a value $d_0$ considered—a priori—to be able to withstand the recovery voltage after the current is interrupted. At time $t_b$, the control angle is modified so that the absolute value of the current I reaches values less than the chopping current, so that there are zero-crossings of the current and so that the minimum value $I_m$ of the current is substantially equal to or slightly less than the measurement accuracy $-\Delta I$ of the measuring means M. The switch opening method then proceeds basically as described above.

The means for implementing the improvement to the invention include a distance sensor, or a position overshoot indicator, or a timer mechanism. In the first instance (distance sensor), the distance sensor measures the distance between the contacts of the switch and the time $t_b$ is the time at which the measured distance reaches the value $d_0$, which in this instance is a predetermined value. In the second instance (position overshoot indicator), a part that moves at the moment that the contacts separate gives a signal at the time $t_b$ at which the distance between the contacts reaches the value $d_0$. In the third instance (timer mechanism), the time $t_b$ is defined by a time delay applied by the timer mechanism. In this instance it is the time $t_b$ that is predetermined and the value $d_0$ is the distance between the contacts of the switch when the time $t_b$ is reached. The value $t_b$ is determined following preliminary tests to ensure that there is always a sufficient distance between the contacts. According to the improvement to the invention, opening the switch then advantageously proceeds without the possibility of pointless interruption of the current occurring, during which breakdowns would be liable to occur, breakdowns always compromising correct operation of the system.

As before (see FIGS. 5-6), the improvement to the invention is shown in FIG. 8 for a current for which the mean value is positive and for which the current minima are negative and have an amplitude substantially equal to the accuracy of the current zero measurement. The improvement to the invention nevertheless relates equally to the situation in which the current has a negative mean value and the current maxima are positive and have an amplitude substantially equal to the inaccuracy of the measurement of the current zero.

Consequently, and generally speaking, the zero crossings of the current flowing through the switch are positioned so that the peak values of the current beyond the zero current are substantially equal to the inaccuracy ($\pm \Delta I$) of the measurement of the current zero.

The invention claimed is:

1. A method of opening a shunt switch (8, 9, 10, 11) carrying a current, the switch being connected in parallel with at least one thyristor (4, 5, 6, 7) of a high voltage DC network, interruption of the current flowing through the switch being initiated at the time of a current zero of the current flowing through the switch, the method being characterized in that it includes, based on a measurement effected by means (M) for measuring the current flowing through the switch, a step of adjusting a control angle of the thyristor to position the current zero in a zone in which the time derivative of the measured current is a continuous function and the absolute value of a peak value of the measured current is substantially equal to the absolute value of the inaccuracy of the measurement of the current zero.

2. A method according to claim 1, wherein, during a period that precedes opening of the switch and during which the current never includes a current zero and has an absolute value that remains greater than the value of the chopping current of the switch, an opening command is applied to the switch at a first time ($t_a$) and a step of simultaneous adjustment of the control angle is initiated to move the peak values of the current closer to zero so that at a second time ($t_b$) that is later than the first time, the contacts of the switch are separated by a substantially predefined distance ($d_0$) enabling the switch to withstand a recovery voltage.

3. A method according to claim 2, wherein a step of measuring the distance (d) between the contacts of the switch is initiated at the first time ($t_a$) and a step of additional adjustment of the control angle is initiated at the second time ($t_b$) to position the current in the zone in which the time derivative of the measured current is a continuous function and the absolute value of a peak value of the measured current is substantially equal to the absolute value of the inaccuracy of the measurement of the current zero.

4. A method according to claim 2, wherein the second time ($t_b$) is initiated by means of a timer device and at the second time ($t_b$) a step of additional adjustment of the control angle is initiated to position the current in the zone in which the time derivative of the measured current is a continuous function and the absolute value of a peak value of the measured current is substantially equal to the absolute value of the inaccuracy of the measurement of the current zero.

5. A method according to claim 2, wherein the second time ($t_b$) is initiated by means of a position overshoot indicator when the distance between contacts reaches a substantially predefined distance ($d_0$) and at the second time ($t_b$) a step of additional adjustment of the control angle is initiated to position the current in the zone in which the time derivative of the measured current is a continuous function and the absolute value of a peak value of the measured current is substantially equal to the absolute value of the inaccuracy of the measurement of the current zero.

* * * * *